US010107562B2

(12) United States Patent
Hsieh et al.

(10) Patent No.: US 10,107,562 B2
(45) Date of Patent: Oct. 23, 2018

(54) HEAT PIPE AND SEALING METHOD THEREOF

(71) Applicant: Kunshan Jue-Chung Electronics Co., Ltd., Kunshan, Jiangsu (CN)

(72) Inventors: Hung-Ping Hsieh, Kunshan (CN); Yu-Po Huang, Kunshan (CN)

(73) Assignee: KUNSHAN JUE-CHUNG ELECTRONICS CO., LTD., Kunshan, Jiangsu (CN)

(*) Notice: Subject to any disclaimer, the term of this patent is extended or adjusted under 35 U.S.C. 154(b) by 14 days.

(21) Appl. No.: 15/256,556

(22) Filed: Sep. 3, 2016

(65) Prior Publication Data
US 2018/0066899 A1 Mar. 8, 2018

(51) Int. Cl.
| B21D 53/06 | (2006.01) |
| F28D 15/04 | (2006.01) |
| B23P 15/26 | (2006.01) |
| B23K 9/007 | (2006.01) |
| B23K 15/00 | (2006.01) |

(Continued)

(52) U.S. Cl.
CPC ........... *F28D 15/046* (2013.01); *B23K 9/007* (2013.01); *B23K 15/0006* (2013.01); *B23K 26/22* (2013.01); *B23P 15/26* (2013.01); *B21D 19/10* (2013.01); *B21D 53/06* (2013.01); *B23P 2700/09* (2013.01)

(58) Field of Classification Search
CPC ........ B21D 53/06; B21D 53/02; B21D 19/10; B21D 19/08; F28D 15/046; B23P 2700/09; B23P 15/26
See application file for complete search history.

(56) References Cited

U.S. PATENT DOCUMENTS

| 2005/0167984 A1* | 8/2005 | Hsu ............ F28D 15/0283 285/382 |
| 2007/0062036 A1* | 3/2007 | Tung ............ B23P 15/26 29/890.032 |
| 2007/0074395 A1* | 4/2007 | Hou ............ B23P 15/26 29/890.032 |

FOREIGN PATENT DOCUMENTS

| CN | 1854669 A | 11/2006 |
| CN | 1936479 A | 3/2007 |

(Continued)

OTHER PUBLICATIONS

Office Action dated Mar. 28, 2018 of the corresponding Taiwan patent application No. 105122293.

*Primary Examiner* — Christopher Besler
(74) *Attorney, Agent, or Firm* — Chun-Ming Shih; HDLS IPR Services

(57) ABSTRACT

A heat pipe and a sealing method thereof; the sealing method for a heat pipe includes the steps of: providing a metal pipe member, the metal pipe member including one end having a sealed end portion formed thereon and another end thereof having a narrowing neck section extended therefrom. The narrowing neck section includes a channel. A compression mold compresses the narrowing neck section and moves away from the metal pipe member in order to compress and elongate the narrowing neck section into a compression elongated column and to seal the channel. Finally, spot welding process is performed on the compression elongated column to form a sealed block thereon. The present invention is of the merits of improved work efficiency for heat pipe bending, compression and testing and increased length of the metal pipe member with enhanced thermal transfer performance of the heat pipe.

8 Claims, 8 Drawing Sheets

(51) Int. Cl.
   *B23K 26/22*   (2006.01)
   *B21D 19/10*   (2006.01)

(56) References Cited

FOREIGN PATENT DOCUMENTS

| JP | 20090024996 A | 2/2009 |
| TW | I273212 B | 2/2007 |
| TW | 200716933 A | 5/2007 |

* cited by examiner

| Providing a metal pipe member and a capillary structure, the metal pipe member comprising one end having a sealed end portion and another end thereof having a narrowing neck section extended therefrom, the narrowing neck section having a channel formed therein, the capillary structure covering an inner wall of the metal pipe member | a |

↓

| Performing the working fluid filling operation and the vacuum extraction operation on the metal pipe member sequentially | b' |

↓

| Providing a compression mold, the compression molding compressing the narrowing neck section and moving in a direction away from the metal pipe member in order to compress and elongate the narrowing neck section to deform into a compression elongated column and to seal the channel | b |

↓

| Performing spot welding and sealing operation on the compression elongated column in order to form a sealed block at the rear end of the compression elongated column | c |

FIG.2

HEAT PIPE AND SEALING METHOD THEREOF

BACKGROUND OF THE INVENTION

Field of the Invention

The present invention is related to a heat dissipating structure, in particular, to a heat pipe and a sealing method thereof.

Description of Related Art

A heat pipe refers to a sealed chamber containing a working fluid therein, and its working principle is to allow the working fluid to undergo phase changes between the two phases of vapor and liquid through heat absorption and releasing along with the utilization of the characteristic of quick uniform temperature reached at the chamber surface such that the goal of heat dissipation can be achieved. In addition, with the advantages of its small size and light weight, a heat pipe can be installed cooperatively at the location of a heat source; therefore, products of heat pipes have become one of the important elements for heat dissipation.

In a traditional heat pipe sealing method, it is to provide a metal pipe member, in which one end of the metal pipe member is sealed while the other end thereof is open, followed by disposing a capillary structure at the internal of the metal pipe member and filling a working fluid therein as well as vacuum operation to extract the air via the opening; a finished heat pipe is as shown in FIG. 1. Finally, the opening area of the heat pipe A is compressed and welded in a sealing operation in order to form a sealed end B.

However, The aforementioned sealed end B tends to have an excessive size such that it is of the following drawbacks: first, during the bending operation of the heat pipe A, the sealed end B must be placed horizontally; otherwise, the sealed end B is like to crack and leading to a disqualified heat pipe during the time when the heat pipe A undergoes the compression process near the end of the manufacturing; second, during the processes of bending, compression and testing, if any collisions occurs at the heat pipe, the sealed end B is prone to bending and again, leading to disqualified heat pipe that may be disposed eventually.

In view of the above, the inventor of the present invention seeks to overcome the aforementioned problems associated with the currently existing techniques after years of research along with the utilization of the academic principles in order to provide an improved solution with objectives of overcoming the existing shortcomings.

SUMMARY OF THE INVENTION

An objective of the present invention is to provide a heat pipe and a sealing method thereof, which utilizes a compression mold to compress one end of a heat pipe in order to elongate such end to form a compression elongated column such that a first sealing process is complete, following which the rear end of the compression elongated column forms a sealed block via spot welding and a secondary sealing process is complete. Consequently, the size of the compression elongated column along with the sealed block is smaller than the size of the sealed end of a known heat pipe. In addition, the hardness of the compression elongated column along with the sealed block is higher than that of the sealed end of a known heat pipe; therefore, it is able to increase the work efficiency of the operations of bending, compression and testing etc. of the heat pipe in addition to that the length of the metal pipe member can be increased and the thermal transfer performance of the heat pipe can be enhanced.

To achieve the aforementioned objective, the present invention provides a sealing method for a heat pipe, comprising the following steps: (a) providing a metal pipe member, the metal pipe member comprising one end having a sealed end portion formed thereon and another end having a narrowing neck section extended therefrom; the narrowing neck section having a channel formed therein; (b) providing a compression mold, the compression mold compressing the narrowing neck section and moving in a direction away from the metal pipe member in order to allow the narrowing neck section to be compressed and elongated to deform into a compression elongated column and to seal the channel; and (c) performing a spot welding and sealing operation on the compression elongated column in order to allow a rear end of the compression elongated column to form a sealed block.

To achieve the aforementioned objective, the present invention provides a heat pipe, comprising: a metal pipe member having a sealed space formed at an internal thereof, and the metal pipe member comprising one end having a sealed end portion formed thereon and another end thereof having a compression elongated column formed thereon, a rear end of the compression elongated column having a sealed block formed thereon; a capillary structure covering an inner wall of the metal pipe member; and a working fluid filled into the sealed space.

The present invention is also of the following advantageous technical effects:

First, the compression mold performs compression on the narrowing neck section and moves in a direction away from the metal pipe member in order to compress and elongate the narrowing neck section to deform into a compression elongated column. Since such compression elongated column is subject to a compression force and a tensile force in a direction away from the metal pipe member altogether, the compression elongated column is able to firmly seal the channel from the top to the bottom thereof in order to enhance the sealing ability of the heat pipe.

Second, by performing the spot welding and sealing operation on the compression elongated column, the rear end of the compression elongated column can be formed of a sealed block. The seal block is formed at the rear end of the compression elongated column via thermal melting; therefore, the sealed block and the compression elongated column can be integrally formed and are of identical thermal expansion coefficient such that the sealed block and the compression elongated column would not break easily under the conditions of thermal expansion and cooling contraction due to temperature changes. Moreover, it is able to reduce the length of the compression elongated column in order to reduce the ineffective end of the heat pipe while increasing the effective length of the heat pipe.

Third, the compression elongated column can be deformed under compression and elongation into a polygonal shape of a triangular shape, rectangular shape, pentagonal shape, hexagonal shape or others such that the compression elongated column has a plurality of angles, which is advantageous in increasing the structural strength of the compression elongated column, and effect of resistance to breakage of the compression elongated column can be advantageously achieved.

BRIEF DESCRIPTION OF DRAWING

FIG. 2 is a flow chart of the steps of the sealing method for a heat pipe of the present invention;

DETAILED DESCRIPTION OF THE INVENTION

Figure 1:
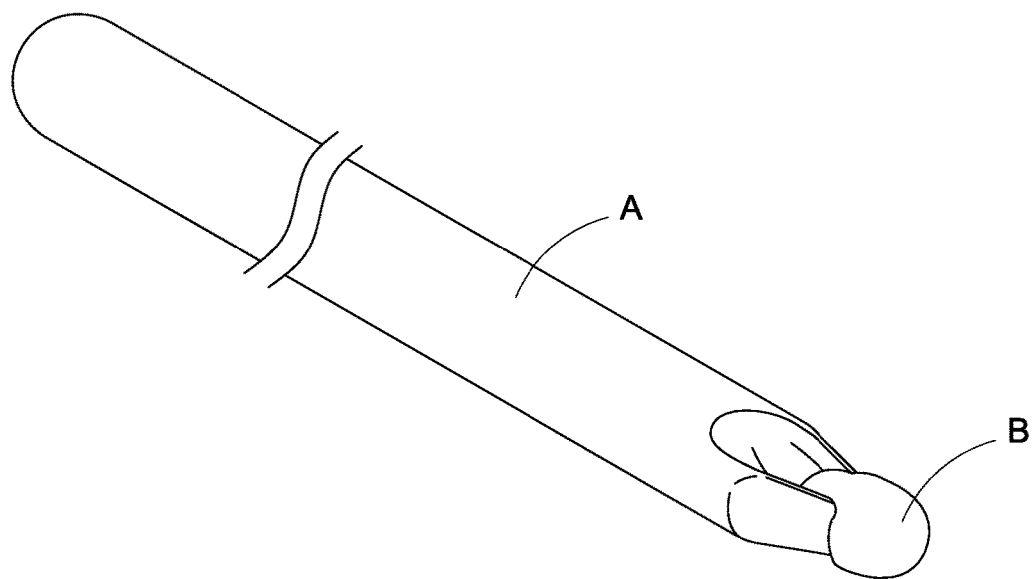
FIG. 1 is an illustration of a known heat pipe.
Figure 3:
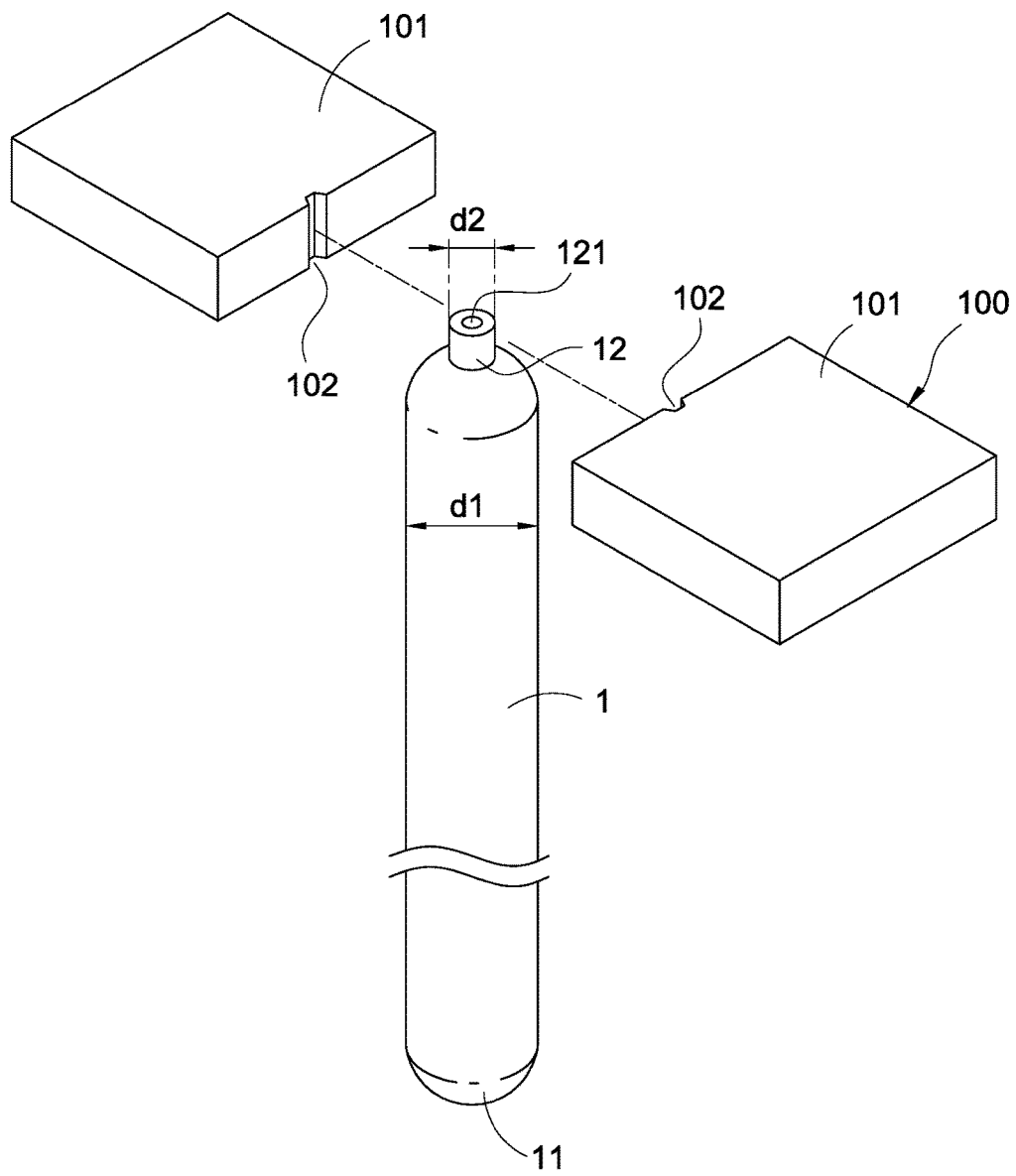
FIG. 3 is an illustration showing a compression process of a compression mold acted on the narrowing neck section of the present invention.

The following provides a detailed description of the present invention and technical contents thereof along with the accompanied drawings. However, it can be understood that the accompanied drawings are provided for illustration purpose only, which shall not be used to limit the scope of the present invention.

As shown in FIG. 1 to FIG. 10, the present invention provides a heat pipe and a sealing method thereof. The heat pipe 10 mainly comprises a metal pipe member 1, a capillary structure 2 and a working fluid.

FIG. 2 shows a flow chart of the steps of the sealing method for the heat pipe 10 of the present invention. In a first step, as shown by step a in FIG. 2 and FIG. 3, a metal pipe member 1 is provided. The metal pipe member 1 comprises one end having a sealed end portion 11 formed thereon and another end thereof having a narrowing neck section 12 extended therefrom. The narrowing neck section 12 includes a channel formed therein. Wherein, an outer diameter d1 of the metal pipe member 1 is greater than an outer diameter d2 of the narrowing neck section 12.

Figure 4:
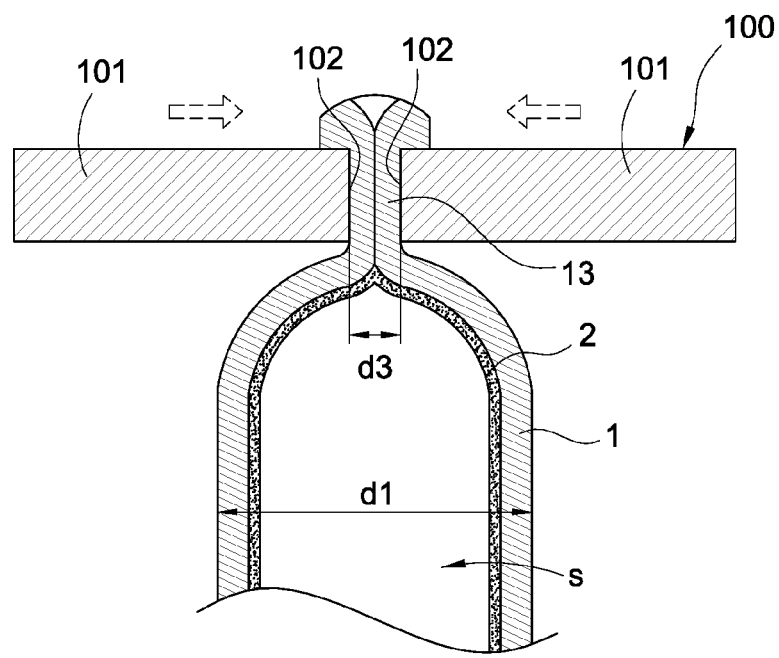
FIG. 4 is an illustration showing the compression mold moving in a direction away from the metal pipe member.
Figure 5:
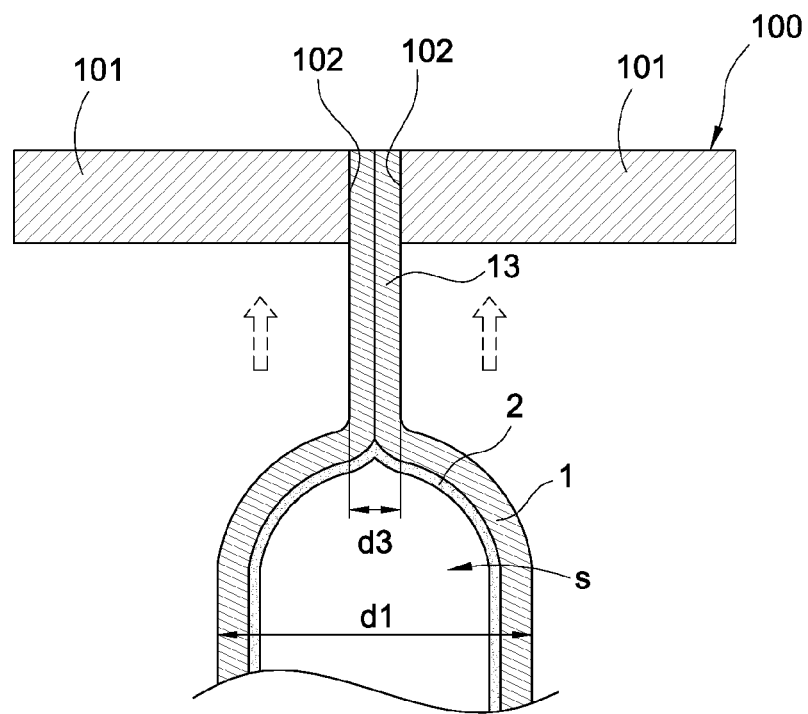
FIG. 5 is an illustration showing the narrowing neck section being compressed and elongated to deform into a compression elongated column of the present invention.
Figure 6:
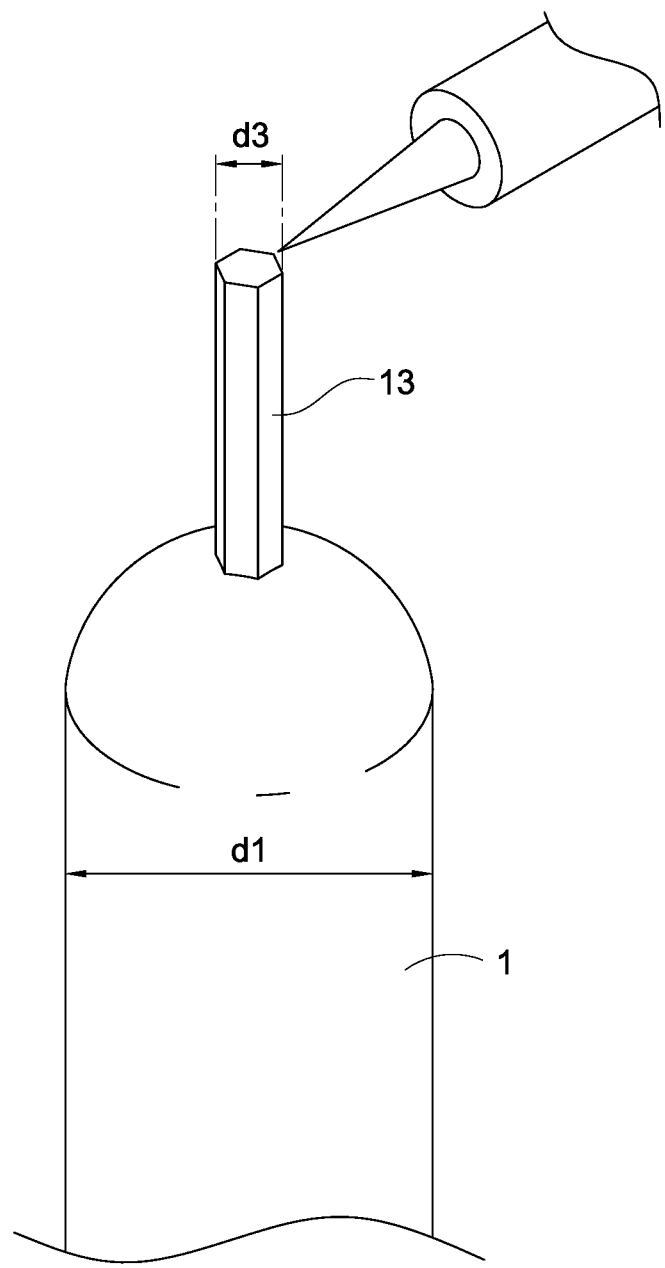
FIG. 6 is an illustration showing a spot welding and sealing operation performed on the compression elongated column of the present invention.
Figure 7:
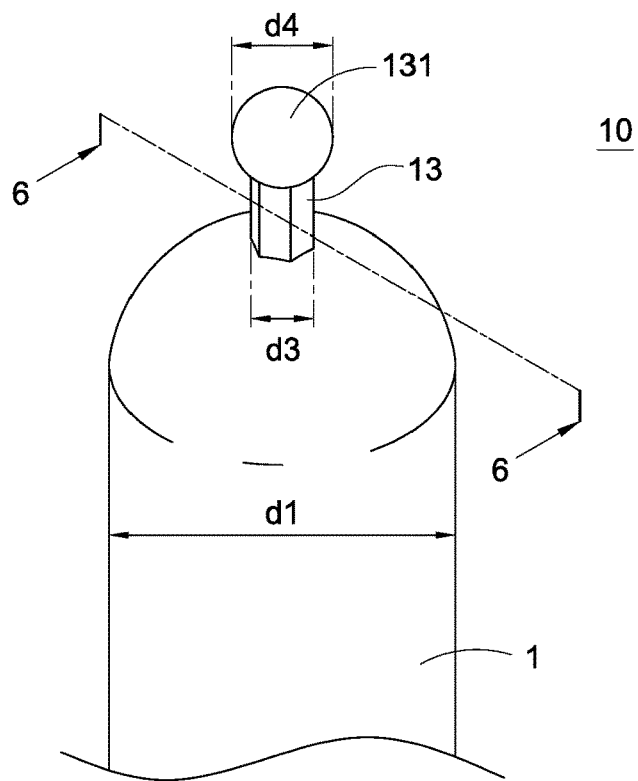
FIG. 7 is a perspective view of a heat pipe of the present invention.
Figure 8:
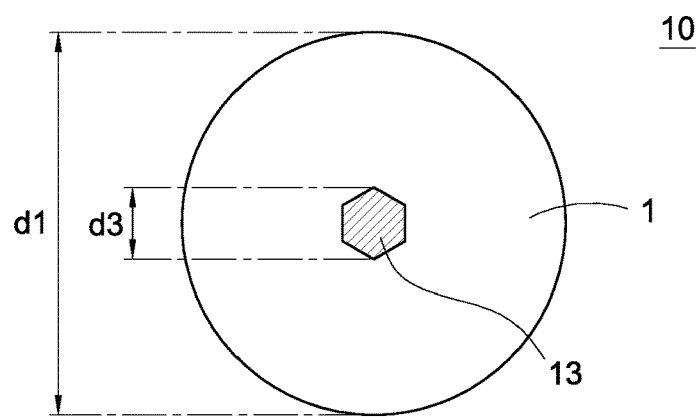
FIG. 8 is a cross sectional view of the heat pipe of the present invention.

In addition, as shown in FIG. 4, in step a of the present invention, a capillary structure 2 is further provided. The capillary structure 2 covers an inner wall of the metal pipe member 1. The capillary structure is formed of a particle sintered structure, a metal mesh, an etched slot or a combination thereof.

Furthermore, the sealing method for the heat pipe 10 of the present invention further comprises a step b' prior to step b, wherein in step b', it is to sequentially perform a working fluid filling operation and a vacuum extraction operation on the metal pipe member 1.

In a second step, as shown in step b in FIG. 2 and FIGS. 4 to 6, a compression mold 100 is provided. The compression mold 100 compresses the narrowing neck section 12 and moves in a direction away from the metal pipe member 1 in order to compress and elongate the narrowing neck section to deform into a compression elongated column 13 and to seal the channel 121. Wherein, an outer diameter d3 of the compression elongated column 13 is smaller than an outer diameter d4 of the sealing block 131, meaning that the outer diameter d1 of the metal pipe member 1 is greater than the outer diameter d3 of the compression elongated column, and the outer diameter d3 of the compression elongated column 13 is smaller than the outer diameter d4 of the sealed block 131.

Moreover, as shown in FIGS. 4 to 8 and FIG. 10, the compression mold 100 comprises two half-molds 1-1, and one side of each one of the half-molds 101 includes a semi-compression slot 102 formed thereon. The inner walls of the two semi-compression slots 102 compress to abut against two sides of the narrowing neck section 12. Each one of the semi-compression slots 102 can be a polygonal slot of a triangular shape, a rectangular shape, a pentagonal shape or a hexagonal shape etc. such that the compression elongated column 13 can be compressed and elongated to deform into a polygonal column of a triangular shape, rectangular shape, a pentagonal shape or a hexagonal shape etc.

Similarly, each one of the semi-compression slot 102 can also be a semi-circular arched slot in order to compress the compression elongated column 13 into a circular column or a cylindroid column.

Figure 9:
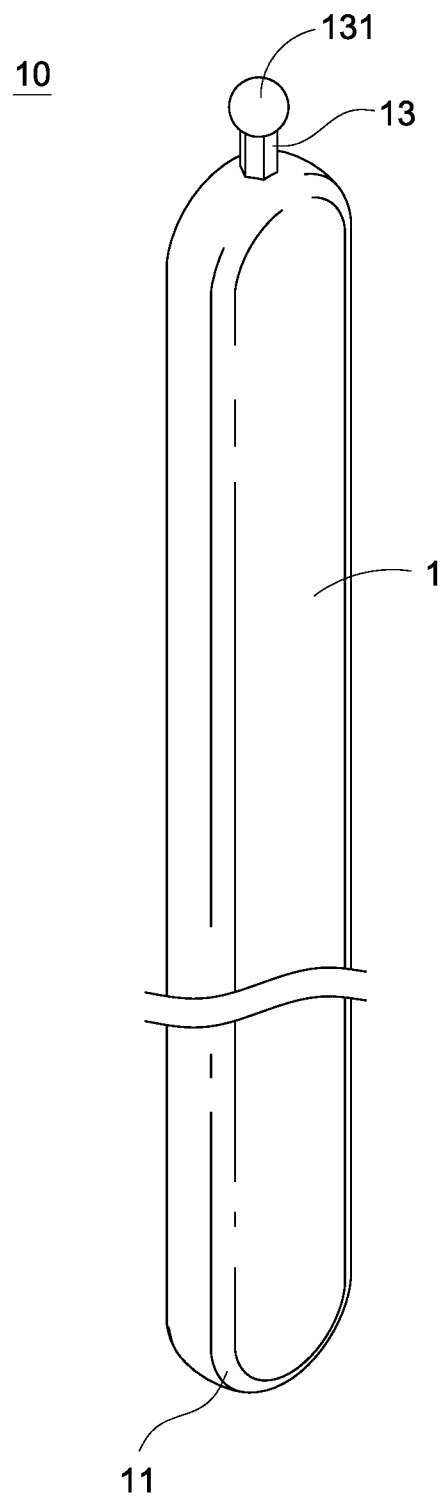
FIG. 9 is another perspective view of the heat pipe of the present invention.
Figure 10:
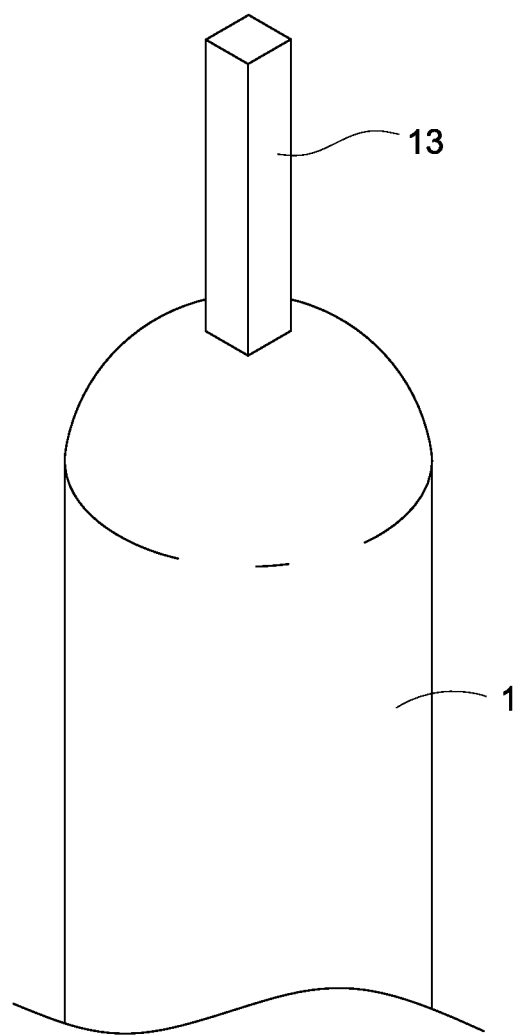
FIG. 10 is a perspective view of another embodiment of the compression elongated column of the present invention.

In a third step, as shown by step c in FIG. 2 and FIGS. 6 to 8, a spot welding and sealing operation can be performed on the compression elongated column 13 in order to allow the rear end of the compression elongated column 13 to form a sealing block 131 thereon. According, the step a to step c can be completed in order to obtain a finished product of the heat pipe 10 of the present invention. Finally, as shown in FIG. 9, compression operation can be performed on the heat pipe.

Furthermore, the sealed block 131 is formed at the rear end of the compression elongated column 13 via thermal melting method; therefore, the sealing block and the compression elongated column 13 can be integrally formed and can be made of the same material. Moreover, the spot welding and sealing operation is to perform an electron-beam welding method, an argon arc welding method or a laser welding method on the rear end of the compression elongated column.

According to a combinational embodiment of the heat pipe 10 of the present invention, it utilizes a metal pipe member 1 having a sealed space S formed therein, and the metal pipe member (comprises one end having a sealed end portion 11 formed thereon and another end there of having a compression elongated column 13 formed thereon. The rear end of the compression elongated column 13 includes a sealed block 13 formed thereon. A capillary structure 2 covers an inner wall of the metal pipe member 1, and a working fluid is filled into the sealed space S. Based on the such structure, a compression mold 100 compresses and elongated on end of the metal pipe member 1 in order to form a compression elongated column 13 at such end and to complete a first sealing process. Next, a spot welding is performed at the rear end of the compression elongated column 13 in order to form a sealing block 131, and a secondary sealing process is complete. In addition, since the rear end of the compression column 13 has already been sealed, the rear end of the compression elongated column requires a smaller area for welding. Consequently, it is able to achieve the advantages of high sealing tightness at the sealed area and a lower cost for the heat pipe.

Furthermore, the compression mold 100 compresses the narrowing neck section 12 and moves in a direction away from the metal pipe member 1 such that the narrowing neck section 12 is compressed and elongated to deform into a compression elongated column 13. Since such compression elongated column 13 is subject to a compression force and a tensile force in a direction away from the metal pipe member 1 altogether, the compression elongated column 13 is able to firmly seal the channel 121 from the top to the bottom thereof in order to enhance the sealing ability of the heat pipe 10.

Moreover, by performing the spot welding and sealing operation on the compression elongated column 13, the rear end of the compression elongated column 13 can be formed of a sealed block 131 such that the following advantageous effects can be achieved. First, since the size of the compression elongated column 13 along with the sealed block 131 is smaller than the size of the sealed end of a known heat pipe, during the bending operation on the metal pipe member 1, there is no difficulty in the placing direction of the compression elongated column 13 along with the sealed block 131 such that the work efficiency of the bending operation can be increased. Second, the compression elongated column 13 is elongated and compressed followed by spot welding; therefore, the hardness of the column elongated column 13 along with the sealing block 131 is higher than the hardness of the sealed end of a known heat pipe, which is particularly advantageous for subsequent operations of bending, compression and testing in such a way that the compression elongated column along with the sealing block 131 would not be bent easily in the event of collision and leading to disposal of the product eventually. Third, under the condition where the heat pipe 10 of the present invention and the heat pipe of a known art are of the same length, since the length of the compression elongated column 13 along with the sealed block 131 is shorter than the length of the sealed end of the known heat pipe, the present invention is of an increased length of metal pipe member 1 such that the thermal transfer performance of the heat pipe 10 can be enhanced.

In addition, since the seal block 131 is formed at the rear end of the compression elongated column 13 via thermal melting; therefore, the sealed block 131 and the compression elongated column 13 can be integrally formed and are of identical thermal expansion coefficient such that the sealed block 131 and the compression elongated column 13 would not break easily under the conditions of thermal expansion and cooling contraction due to temperature changes. Moreover, the rear end of the compression elongated column 13 is formed of the sealed block 131 via the thermal melting method, it is able to further reduce the length of the compression elongated column 13 in order to reduce the ineffective end of the heat pip 10e while increasing length of the effective end (metal pipe member 1) of the heat pipe 10.

Furthermore, the compression elongated column 13 can be deformed under compression and elongation into a polygonal shape of a triangular shape, rectangular shape, pentagonal shape, hexagonal shape or others such that the compression elongated column 13 has a plurality of angles, which is advantageous in increasing the structural strength of the compression elongated column 13, and effect of resistance to breakage of the compression elongated column can be advantageously achieved.

In view of the above, the heat pipe and the sealing method thereof of the present invention described above are novel while being neither unseen in similar products nor publicly used in addition to its industrial applicability, novelty and inventive step, which completely satisfies the patentability required for a patent. The present invention is, therefore, legitimately applied and respectfully seeks the grant of the patent in light protecting the right of the inventor.

What is claimed is:

1. A sealing method for a heat pipe, comprising:
   (a) providing a metal pipe member, the metal pipe member comprising one end having a sealed end portion formed thereon and another end having a narrowing neck section extended therefrom; the narrowing neck section having a channel formed therein;
   (b) providing a compression mold, the compression mold compressing the narrowing neck section and sliding in an axial direction of the narrowing neck section away from the metal pipe member while the compression mold keeps compressing the narrowing neck section in order to allow the narrowing neck section to be compressed and elongated to deform into a compression elongated column and to seal the channel; and
   (c) performing a thermal melting and sealing operation on the compression elongated column in order to allow a rear end of the compression elongated column to form a sealed block.

2. The sealing method for a heat pipe according to claim 1, wherein the compression mold in step (b) comprises two half molds, and one side of each one of the half-molds includes a semi-compression slot formed thereon; inner walls of the two semi-compression slots are compressed to abut against two sides of the narrowing neck section.

3. The sealing method for a heat pipe according to claim 2, wherein each one of the semi-compression slot is a semi-polygonal slot in order to compress the compression elongated column into a polygonal column.

4. The sealing method for a heat pipe according to claim 2, wherein each one of the semi-compression slot is a semi-circular arched slot in order to compress the compression elongated column into a circular column or a cylindroid column.

5. The sealing method for a heat pipe according to claim 1, wherein the spot welding and sealing operation in step (c) is to perform an electron-beam welding method, an argon arc welding method or a laser welding method on the rear end of the compression elongated column.

6. The sealing method for a heat pipe according to claim 1, wherein an outer diameter of the metal pipe member in step (c) is greater than an outer diameter of the narrowing neck section, and an outer diameter of the compression elongated column in step (c) is smaller than an outer diameter of the sealed block.

7. The sealing method for a heat pipe according to claim 1, wherein the step (a) further comprising providing a capillary structure; the capillary structure covers an inner wall of the metal pipe member; the capillary structure is formed of a particle sintered structure, a metal mesh, an etched slot or a combination thereof.

8. The sealing method for a heat pipe according to claim 7, further comprising a step (b') prior to the step (b), where the step (b') comprises sequentially performing a working fluid filling operation and a vacuum extraction operation on the metal pipe member.

* * * * *